United States Patent [19]
Heinen et al.

[11] Patent Number: 5,359,224
[45] Date of Patent: Oct. 25, 1994

[54] INSULATED LEAD FRAME FOR INTEGRATED CIRCUITS AND METHOD OF MANUFACTURE THEREOF

[75] Inventors: Katherine G. Heinen, Dallas, Tex.; Henry F. Breit, Attleboro, Mass.

[73] Assignee: Texas Instruments Incorporated, Dallas, Tex.

[21] Appl. No.: 92,659

[22] Filed: Jul. 15, 1993

Related U.S. Application Data

[63] Continuation of Ser. No. 31,086, Mar. 12, 1993, abandoned, which is a continuation of Ser. No. 587,189, Sep. 24, 1990, abandoned.

[51] Int. Cl.$^5$ ..................... H01L 23/48; H01L 23/28
[52] U.S. Cl. ................... 257/666; 257/691; 257/696; 257/784; 257/787
[58] Field of Search ........... 357/70, 72, 74, 80; 437/207, 211, 220, 235; 174/52.2, 52.5; 427/96; 257/666, 677, 632, 691, 696, 692, 701, 784, 786, 787

[56] References Cited
U.S. PATENT DOCUMENTS

| | | | |
|---|---|---|---|
| 3,783,347 | 1/1974 | Vladik | 357/72 |
| 4,707,724 | 11/1987 | Suzuki et al. | 357/72 |
| 4,862,245 | 8/1989 | Pashby et al. | 357/70 |

FOREIGN PATENT DOCUMENTS

| | | | |
|---|---|---|---|
| 62-235763 | 10/1987 | Japan | 357/70 |
| 2100356 | 4/1990 | Japan | 357/70 |

Primary Examiner—Mark V. Prenty
Attorney, Agent, or Firm—Robby T. Holland; Wade James Brady III; Richard L. Donaldson

[57] ABSTRACT

An insulated lead frame is disclosed. The preferred embodiment contains a lead over chip lead frame having an aluminum oxide insulator on portions of the power supply busses where no electrical connections will be made. The aluminum oxide may be easily deposited by an arc deposition process such as by plasma deposition. A mask prohibits the aluminum oxide from coating the places on the power supply busses where electrical connection, such as by wire bond, will be made. Wire bonds crossing over the power supply busses as they connect bond pads to the lead fingers of the lead frame are therefore less likely to short to the insulated power supply busses. A semiconductor packaged device having an aluminum oxide coating to the underside of the chip support pad is also disclosed. The aluminum oxide coating promotes adhesion between the chip support pad and the encapsulant, that is typically plastic, thereby preventing the chance of delamination and package cracking.

17 Claims, 5 Drawing Sheets

INSULATED LEAD FRAME FOR INTEGRATED CIRCUITS AND METHOD OF MANUFACTURE THEREOF

This application is a continuation of application Ser. No. 08/031,086 filed Mar. 12, 1993, and now abandoned, which is a continuation of application Ser. No. 07/587,189 filed Sep. 24, 1990 and now abandoned.

FIELD OF THE INVENTION

This invention relates to integrated circuits, and more particularly to a lead frame for use with integrated circuitry packaging.

BACKGROUND OF THE INVENTION

An integrated circuit packaged device generally includes an integrated circuit chip lying on a chip support pad. Wire bonds connect the IC to a lead frame. A substance, such as plastic, encapsulates the structure. The plastic small outline J lead (PSOJ) package is one exemplary example. For application, one technique uses reflow solder to surface mount the IC package to a printed circuit board.

As the industry moves towards thinner packages and packages containing chips of larger size for higher volumetric packaging, new packaging techniques are evolving. One such technique is the lead over chip package, (LOC). As described in the article entitled *Volume Production of Unique Plastic Surface Mount Modules For The IBM 80-ns 1-Mbit DRAM Chip by Area Wire Bond Techniques* by William C. Ward, published at the 38th ECC in IEEE 1988, pages 552–557, this technique disposes a lead frame over the active area of an integrated circuit. Adhesive insulating tape attaches the lead frame to the integrated circuit chip. Wire bonds connect the circuit to the centrally disposed power supply busses. And, wire bonds jump over the power supply busses to connect the integrated circuit to conductive lead fingers. No chip support pad is required.

Concerns exist about potential wire bond shorting to the power bus portions of the lead frame in the LOC package. Since the wires to the signal pins cross the metal lead frame power bus, the opportunity for shorting may arise from assembly processes such as poor bond location, wire loop control, mold compound sweep, or from accidental touching during processing.

One approach to minimize shorting problems suggests the use insulated wire. See, *Insulated Aluminum Bonding Wire For High Lead Count Packaging* by Alex J. Oto, International Journal For Hybrid Microelectronics, Vol. 9, No. 1, 1986. While insulated wire has been reported to have some degree of success in conventional assembly packages, the successful implementation in a LOC package is questionable due to the nature of the wire bond stitch as it occurs over the insulating film on top of the integrated circuit; the probability of successful implementation is therefore less likely. Additionally, insulated wire is expensive.

Concerns also exist about potential delamination between the molding compound used to encapsulate the package and the metallic lead frame in the LOC package. Delamination in the vicinity of the wire bonds can cause shear failures resulting in breakage of the wire bonds.

Additionally, with respect to both conventionally packaged devices and LOC packaged devices, delamination of mold compound creates a significant problem resulting in plastic package cracking during attachment to a printed circuit board. During reflow solder, the heat generated by the process can enhance the state of thermal mismatch between dissimilar materials in the IC package creating high stresses. During the reflow solder process, where the temperature ranges between about 215 C. to 260 C., any moisture that may be present in the encapsulating mold compound is converted to steam. The steam pressure can cause delamination and package cracking. In order to avoid this problem, "dry packing" is typically required.

It is an object of this invention to provide a solution to wire bond shorting in lead over chip integrated circuit packaged devices.

It is a further object of this invention to provide a solution to package cracking in both lead over chip integrated circuit packaged devices and conventionally packaged devices.

Other objects and benefits of this invention will be apparent to those of ordinary skill in the art having the benefit of the description to follow herein.

SUMMARY OF THE INVENTION

An insulated lead frame is disclosed. The preferred embodiment contains a lead over chip lead frame having an aluminum oxide insulator on portions of the power supply busses where no electrical connections will be made. The aluminum oxide may be easily deposited by an arc deposition process such as by plasma deposition. A mask prohibits the aluminum oxide from coating the places on the power supply busses where electrical connection, such as by wire bond, will be made. Wire bonds crossing over the power supply busses as they connect bond pads to the lead fingers of the lead frame are therefore less likely to short to the insulated power supply busses.

A semiconductor packaged device having an aluminum oxide coating to the underside of the chip support pad is also disclosed. The aluminum oxide coating promotes adhesion between the chip support pad and the encapsulant, that is typically plastic, thereby preventing the chance of delamination and package cracking.

DETAILED DESCRIPTION OF SPECIFIC EMBODIMENT

Figure 1:
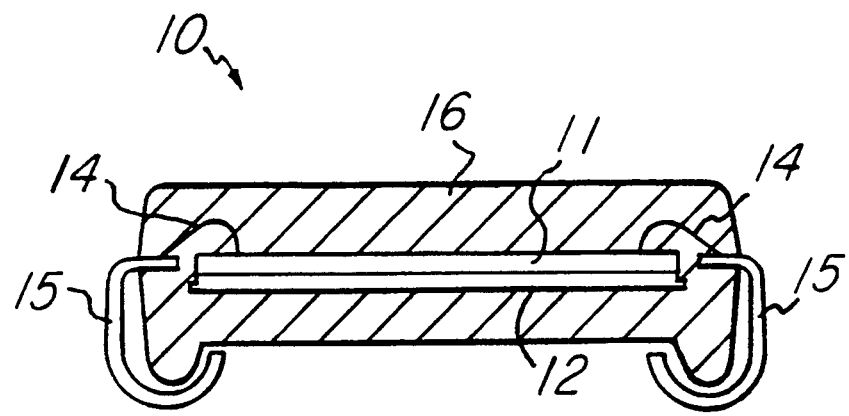
FIG. 1 is a cross section view of a typical integrated circuit package.

FIG. 1 illustrates an integrated circuit packaged device 10 constructed in the industry standard plastic small outline J-leaded (PSOJ) surface mount package. A semiconductor integrated circuit chip 11 rests on a mount support pad (chip attach) 12. Wire bonds 14 connect the bonding pads (not shown) located along the outer edges of semiconductor circuit 11 to conductive "J" shaped lead fingers 15. A mold compound material 16 such as plastic encapsulates the components.

Figure 2:
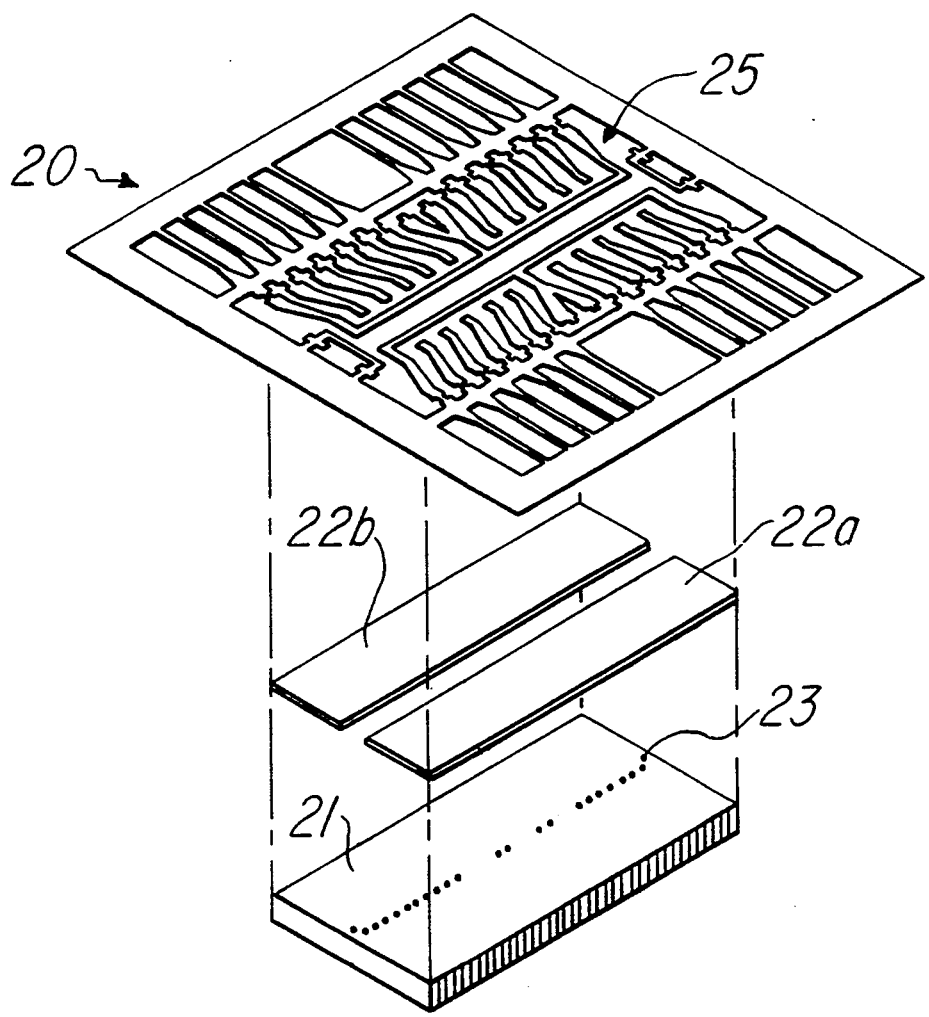
FIG. 2 is a perspective, exploded view of a lead over chip center bond device illustrating the lead frame, adhesive tape, and integrated circuit.

FIG. 2 illustrates an initial stage of the LOC concept. The following copending and coassigned applications also describe the LOC concept:

| Serial No. | Inventor | Filed | TI-Docket |
|---|---|---|---|
| 373,742 | Heinen, et al. | 06/30/89 | 14287 |
| 455,210 | Lim, et al. | 12/22/89 | 14600 |
| 455,105 | Lim, et al. | 12/22/89 | 14603 |

In packaged device 20 of FIG. 2, the bond pads 23 lie along the central horizontal axis of semiconductor integrated circuit chip 21. Semiconductor 21 lies beneath lead over chip lead frame 25. Lead over chip lead frame 25 may be formed of conductive metal. An example is full hard temper CDA alloy 151 about 0.008 inches thick that may be spot plated in gold, silver, or the like. Semiconductor chip 21 may be, for example, a 16 Megabit Dynamic Random Access Memory (DRAM) storing more than 16 million data bits on a semiconductor substrate about 325×660 mils. Two pieces of double sided adhesive tape 22a and 22b are disposed over the top active surface of semiconductor circuit 21 and attach lead frame 25 over the top of chip 21. It is this configuration that leads to the description "lead over chip", (LOC). The centrally disposed bond pads 23 lead to the further description "lead over chip center bond", LOCCB. Double sided adhesive tape 22a and 22b may comprise, for example, a double sided thermosetting epoxy adhesive coated polyimide film that also acts as an active barrier. The chip 21 and the lead frame 25 form a self supporting structure. No chip support pad is required.

Figure 2A:
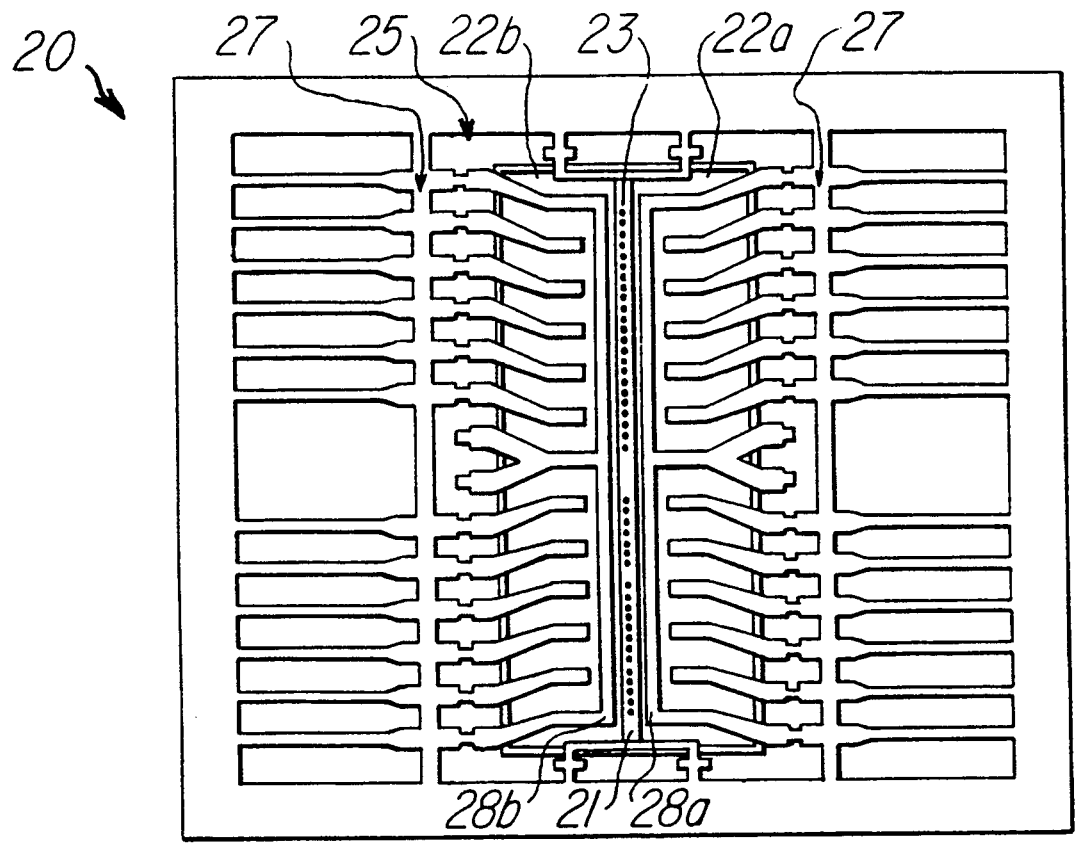
FIG. 2a is a top view of the lead over chip center bond device illustrating the connection of the integrated circuit chip thereunder.

FIG. 2a depicts the resulting structure when the lead frame 25 is affixed over the integrated circuit 21 in the manner shown in FIG. 2. The power busses 28a and 28b comprise spaced apart parallel conductive busses that run along the middle of the chip 21. Power supply bus 28a, for example, may provide Vss and power supply bus 28b may supply Vdd. The adhesives 22a and 22b are spaced apart such that the bond pads 23 of chip 21 are exposed for bonding to the conductive lead fingers 27 of lead frame 25.

Figure 2B:
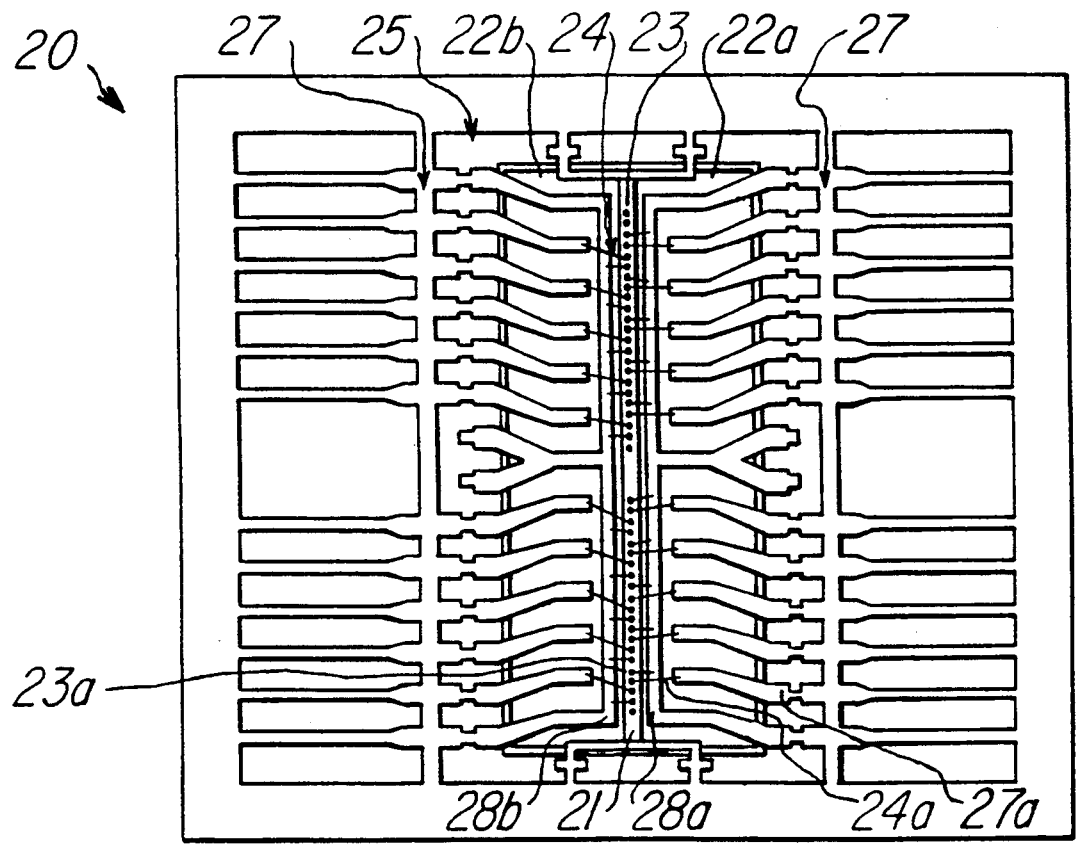
FIG. 2b is a top view of the lead over chip center bond device illustrating the connecting wire bonds.

FIG. 2b illustrates a subsequent assembly stage of packaged device 20 wherein high speed thermosonic gold ball wire bonding is accomplished to connect the bond pads 23 to various lead fingers 27 and to the power supply busses 28a and 28b. While various types of wire bonding may be utilized, bonding using about 0.001 in diameter gold wire is sufficient. One end of the wire bonds 24 are connected to various of the bond pads 23. The other end of various wire bonds 24 are connected to the two centrally disposed power supply busses 28a and 28b of lead frame 25. Multiple wire bond contacts may be made to these busses to more efficiently distribute voltage. The other end of various wire bonds 24 cross over a power supply bus to make contact with the internal ends of the conductive lead fingers 27. Wire bond 24a is exemplary. One end of wire bond 24a is attached to the internal end of lead finger 27a. Wire bond 24a passes over power supply bus 28a where the other end of wire bond 24a is connected to bond pad 23a. An undesirable wire sweep could result in wire bond 24a touching power supply bus 28a thereby causing an undesirable short.

Figure 2C:
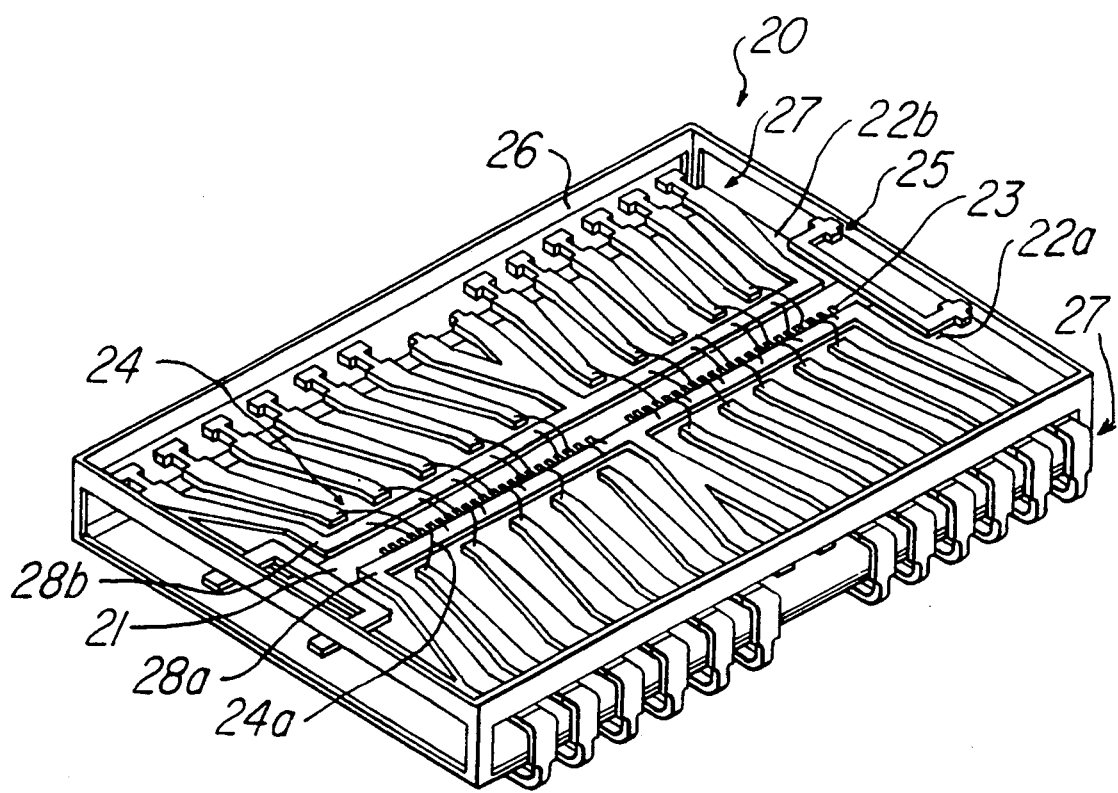
FIG. 2c is a top view of the lead over chip center bond device wherein the encapsulating mold compound is rendered transparent.

FIG. 2c illustrates packaged device 20 in a subsequent assembly stage with the plastic encapsulant 26 rendered transparent. Transfer molding is accomplished using a molding compound such as a Novolac epoxy. Low stress mold techniques work well in encapsulating the device. The plastic encapsulant 26 surrounds the integrated circuit 21, the lead frame 25, and the wire bonds 24 to form a plastic body. The lead frame 25 is trimmed and the lead fingers 27 are bent in the "J" shape with the outer lead finger ends extending through the plastic encapsulant 26 so that suitable physical and electrical connection may be made with external circuitry. There are 24 lead fingers 27 extending through the plastic encapsulant.

Figure 2D:
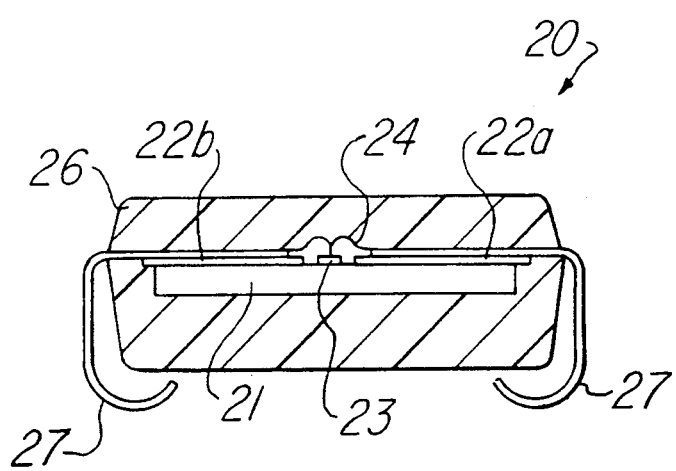
FIG. 2d is a side view of the completed lead over chip center bond package.

FIG. 2d is a side view of the completed lead over chip packaged device 20. The package size for the die size above described may be on the order of about 400×725 mils and may be thinner than about 50 mils. The external appearance of the package is that of a 24 pin PSOJ.

Figure 2E:
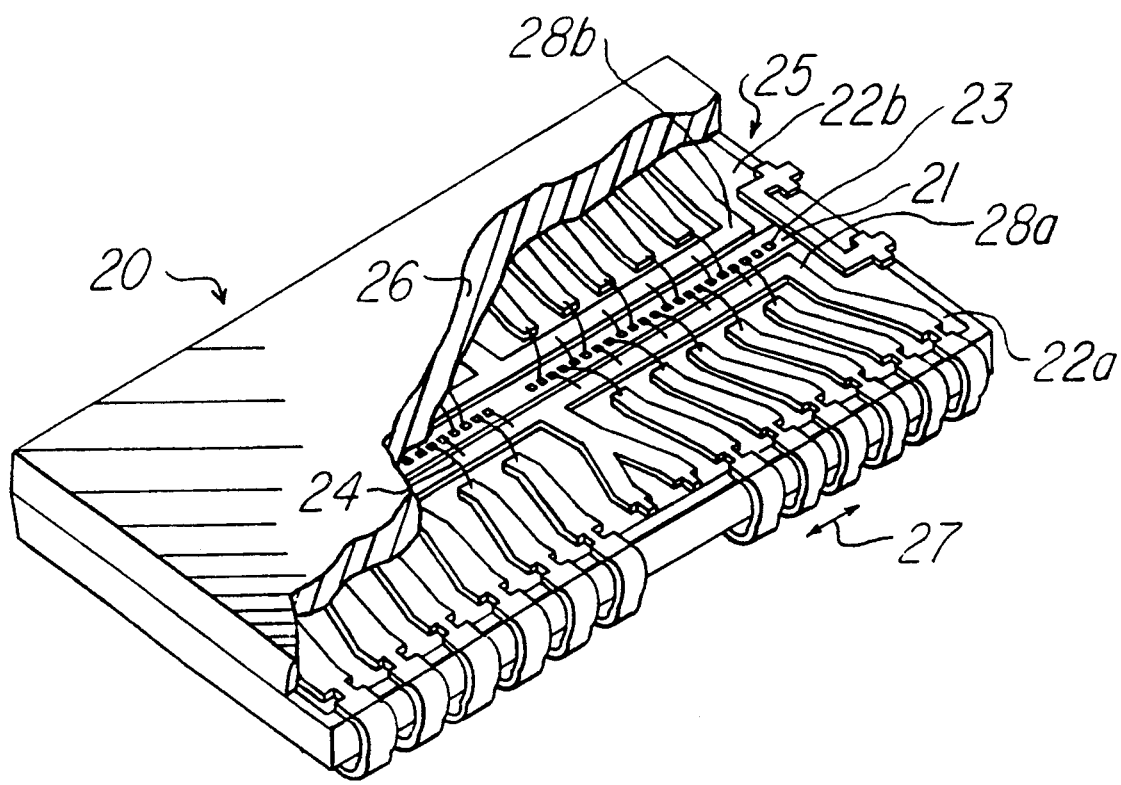
FIG. 2e is a perspective view, partially broken away, of the completed lead over chip center bond integrated circuit package.

FIG. 2e illustrates in perspective a partially cut away view of the finished semiconductor packaged device package 20.

Figure 3:
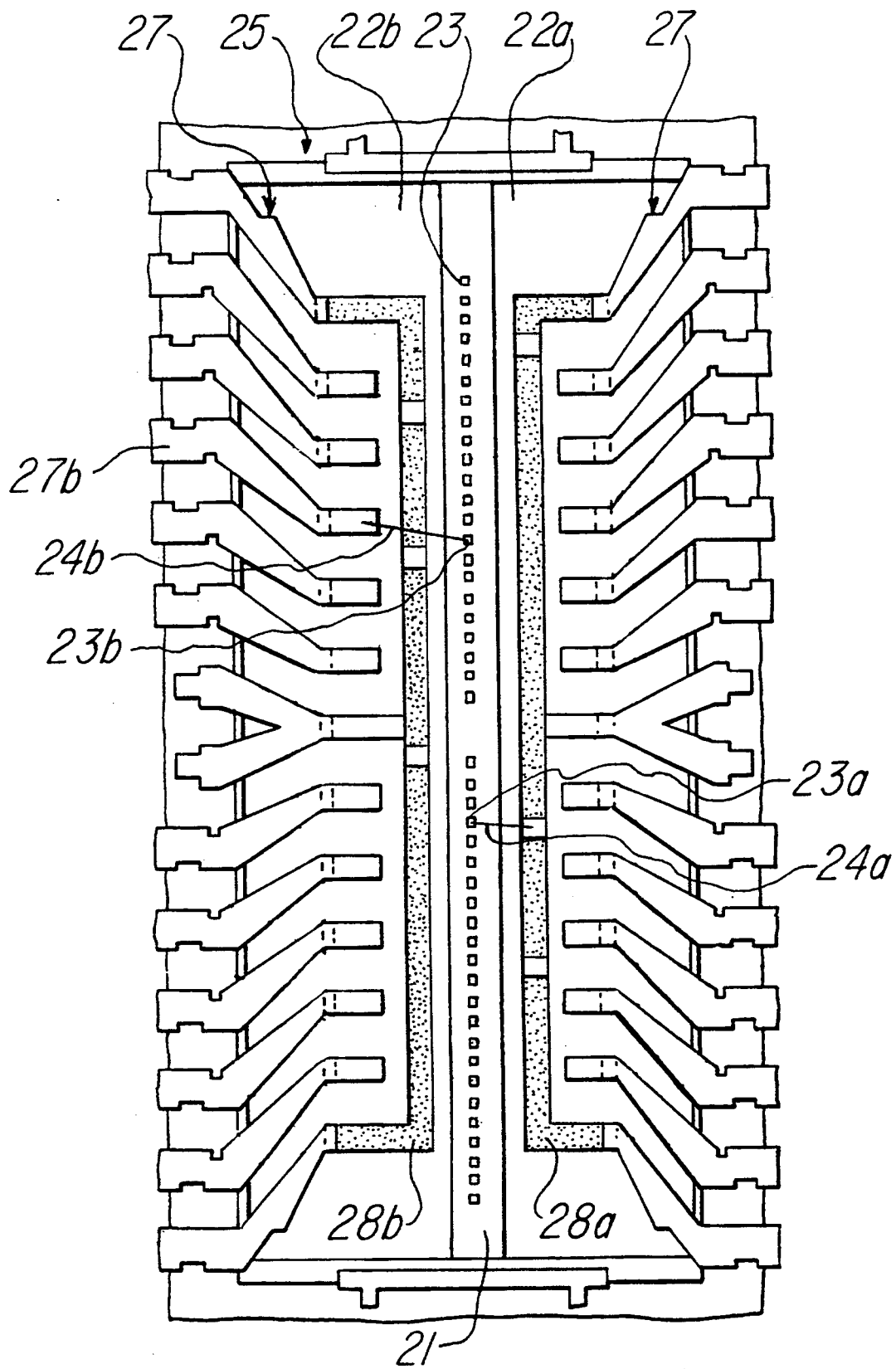
FIG. 3 is a top view of the lead over chip lead frame according to the invention illustrating the addition of an insulating dielectric to selected portions of the power supply busses.

FIG. 3 is a partial broken away top view of the lead over chip center device of FIG. 2b illustrating the preferred embodiment of the invention. (For clarity, only two wire bonds are illustrated in FIG. 3. The lead frame 25 is broken away from its outer edges.) The lead frame 25 is significantly improved by the addition of insulator (dielectric) 30 that covers selected portions of power supply busses 28a and 28b. The dielectric 30 covers the power supply busses except where the wire bonds 24 are connected to them. The shaded portions of power supply busses 28a and 28b illustrate the applied insulator 30; the unshaded portions of power supply busses 28a and 28b illustrate the uninsulated areas of the power supply busses.

In FIG. 3, wire bond 24b has one end connected to bond pad 23b. Wire bond 24b crosses over an insulated portion of power supply bus 28b. The other end of wire bond 24b is connected to lead finger 27b. Wire bond 24a has one end connected to bond pad 23a. The other end of wire bond 24a is connected to an uninsulated portion of power supply bus 28a. The addition of insulator 30 reduces the chance that wire bond 24b could short to power supply bus 28b.

Although insulator 30 of FIG. 3 may be of any insulating material, the preferred embodiment uses an insulator such as the commercially available Aluminum oxide $Al_2O_3$. Use of aluminum oxide allows the insulator to be applied on the lead frame 25 by a standard commercial, low cost, high deposition rate, arc deposition process such as flame spray deposition and plasma arc deposition.

By knowing the lead finger/bond pad and lead finger/power supply bus connection scheme, a mask can be made corresponding to the wire bond crossings and connections of the power supply busses. Aluminum oxide is then arc deposited onto the desired areas of the power supply busses. In the plasma arc deposition process, the gas that is passed through a non-transferred electric arc becomes partially or fully ionized and is expelled out of the plasma generating device. The plasma provides heat to powder particles and the plasma and powder are propelled toward the lead frame. Upon striking the lead frame, the particles are rapidly solidified and the coating is created. The mask prevents the coating from forming on the undesired areas.

The length of the uncovered portions of the power supply busses for wire bond connection is adjustable by varying the size of the mask. In the preferred embodiment of FIG. 3, the uncovered portions are each about 0.015 inches. Of course, the area of the power supply busses that is insulated by arc deposition is selectable and variable by changing the mask pattern. Only specific portions of the power supply busses can be insulated if that is desirable; the entire portion of lead frame 25 illustrated in FIG. 3 can also be insulated if that is desirable. The deposition process can be applied to the lead frame before packaging or to a partially assembled package.

The thickness of the insulator 30 is also adjustable by the plasma deposition parameters. Although the thickness may be greater, or lesser, insulator 30 is a thin film layer of plasma arc deposited $Al_2O_3$ ranging from between about 0.0005 inches to 0.05 inches. In the preferred embodiment, insulator 30 is about 0.001 inches thick. The dielectric strength is dependent upon the thickness. A 0.03 inch thick plasma arc deposited coating yields an insulator having about a 1500 volt dielectric strength while a 0.05 inch thick plasma arc deposited coating yields an insulator having about a 3000 volt dielectric strength.

The arc deposited aluminum oxide also aids in preventing plastic package cracking during surface mount in both conventional packages and packages utilizing lead over chip lead frame construction. Arc deposited aluminum oxide onto a metallic lead frame improves adhesion of the molding compound to the lead frame and thereby reduces delamination occurring during surface mounting by reflow solder.

Figure 4:
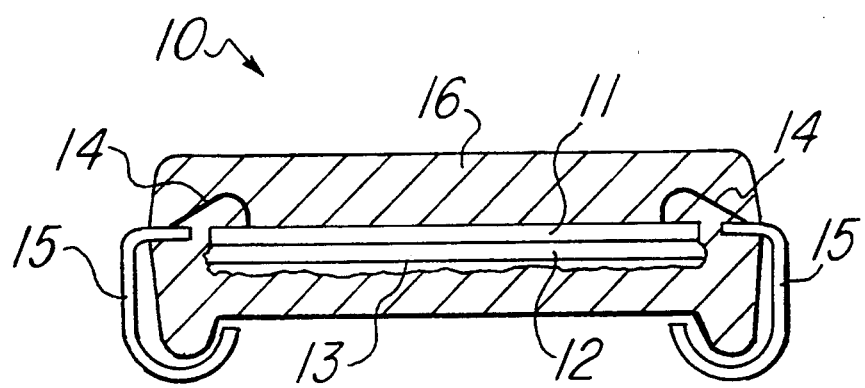
FIG. 4 is a side view of the typical integrated circuit package of FIG. 1 improved by an aspect of the invention.

FIG. 4 illustrates the preferred embodiment of the arc deposited aluminum oxide to the conventional packaged device 10 of FIG. 1. By standard arc deposition, the aluminum oxide layer 13 is applied onto the bottom of the metal chip support pad 12. The aluminum oxide layer 13 thickness is as described above.

The parameters of the standard arc deposition process are controllable to yield deposited insulators of various roughness thereby further promoting adhesion within a packaged device package. As described in copending and coassigned application Ser. No. 455,105 filed Dec. 22, 1989 (TI-14603) by Lim, roughing the backside of the semiconductor die promotes adhesion of the die to the plastic encapsulant and helps prevent cracking during surface mount. The plasma deposited film 30 of FIG. 3 and the plasma deposited film 13 of FIG. 4 having a RMS (where RMS is the root mean square surface finish parameter of the film) of around about 130 micrometers is exemplary, although other values will also aid to reduce delamination.

The arc deposited aluminum oxide to the LOCCB package lead frame not only aids in preventing wire bond shorting to the centrally disposed power supply busses, but also helps prevent delamination between the lead frame and the plastic encapsulant mold compound by increasing adhesion. The process is not limited to the LOCCB package lead frame and is applicable to almost any lead frame configuration, including the industry standard PSOJ package that uses a chip support pad, to promote adhesion and reduce delamination.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. An insulated lead frame, comprising:
   a first plurality of conductive lead fingers;
   a second plurality of conductive lead fingers;
   a first power supply bus lying between the first and second pluralities of conductive lead fingers;
   a second power supply bus lying between the first and second pluralities of conductive lead fingers, adjacent to the first power supply bus; and
   an aluminum oxide insulator on selected portions of the first power supply bus and on selected portions of the second power supply bus, the selected portions of the first and second power supply busses having no electrical connection made to them.

2. The insulated lead frame of claim 1 wherein the aluminum oxide is plasma arc deposited.

3. The insulated lead frame of claim 1 wherein the aluminum oxide is flame spray deposited.

4. A semiconductor packaged device, comprising:
   a semiconductor integrated circuit chip having an active face and a plurality of centrally located bonding pads on its active face;
   a lead frame overlying the active face of the semiconductor integrated circuit chip having a plurality of lead fingers and having at least two power supply busses;
   a plurality of wire bonds, some that cross over a power supply bus for connecting some of the centrally located bonding pads to some of the plurality of lead fingers, and some that connect other of the centrally located bonding pads to the power supply busses;
   an encapsulant, encapsulating the semiconductor integrated circuit chip, the .plurality of wire bonds, and the lead frame such that portions of the plurality of lead fingers extend through the encapsulant so that external electrical connections may be made to the semiconductor integrated circuit chip; and
   an aluminum oxide dielectric coating on the power supply busses where some of the plurality of wire bonds cross over the power supply busses when connecting some of the centrally located bonding pads to some of the plurality of lead fingers.

5. The packaged device of claim 4 wherein the dielectric coating of aluminum oxide is about .001 inches thick.

6. The packaged device of claim 4 wherein the dielectric coating of aluminum oxide is between the range of about 0.0005 to 0.05 inches thick.

7. The packaged device of claim 4 wherein the aluminum oxide has a roughened surface.

8. The packaged device of claim 7 wherein the roughened surface of the aluminum oxide has a RMS of about 130 micrometers.

9. The packaged device of claim 4 wherein the aluminum oxide is arc deposited by plasma deposition.

10. The packaged device of claim 4 wherein the aluminum oxide is arc deposited by flame spray deposition.

11. An insulated lead frame comprising:
 a first plurality of conductive lead fingers;
 a second plurality of conductive lead fingers;
 a power supply bus lying between the first and second pluralities of conductive lead fingers; and
 a ceramic insulator on selected portions of the power supply bus, the selected portions of the power supply bus having no electrical connection made to them.

12. The insulated lead frame of claim 11 wherein the ceramic insulator is an oxide.

13. The insulated lead frame of claim 12 wherein the oxide is aluminum oxide.

14. An encapsulated semiconductor device, comprising:
 a semiconductor die having a plurality of terminals thereon disposed within an encapsulating material;
 a lead frame having a plurality of lead fingers and a power supply bus connected to one of the plurality of lead fingers disposed within the encapsulating material, and having portions of the plurality of lead fingers extending out of the encapsulating material;
 a means for connecting some of the plurality of lead fingers to some of the plurality of terminals of the semiconductor die that crosses over the power supply bus and is disposed within the encapsulant; and
 a ceramic insulator on the power supply bus where the means for connecting some of the plurality of lead fingers to some of the plurality of terminals crosses over the power supply bus.

15. The encapsulated semiconductor device of claim 14 wherein wire bonds comprise the means for connecting some of the plurality of lead fingers to some of the plurality of terminals of the semiconductor die.

16. The encapsulated semiconductor device of claim 14 wherein the insulator is aluminum oxide which is deposited onto the power supply bus.

17. A semiconductor device, comprising:
 a semiconductor integrated circuit chip with a terminal thereon;
 a lead finger;
 a metal strip lying between the terminal of the semiconductor integrated circuit chip and the lead finger;
 a ceramic insulator coating on a portion of the metal strip; and
 a connecting means for connecting the terminal to the lead finger, the connecting means disposed over the ceramic insulator coating.

* * * * *